(12) United States Patent
Sugimoto

(10) Patent No.: US 9,816,762 B2
(45) Date of Patent: Nov. 14, 2017

(54) HEAT EXCHANGER HAVING A PASSAGE PIPE

(75) Inventor: Naoki Sugimoto, Anjo (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 1168 days.

(21) Appl. No.: 13/068,429

(22) Filed: May 11, 2011

(65) Prior Publication Data

US 2011/0284197 A1 Nov. 24, 2011

(30) Foreign Application Priority Data

May 21, 2010 (JP) .................................. 2010-117715
Apr. 21, 2011 (JP) .................................. 2011-95448

(51) Int. Cl.
*F28D 1/02* (2006.01)
*F28F 7/00* (2006.01)
(Continued)

(52) U.S. Cl.
CPC ............ *F28F 3/025* (2013.01); *F28D 1/0333* (2013.01); *H01L 23/473* (2013.01);
(Continued)

(58) Field of Classification Search
CPC ........... H05K 7/20218; H05K 7/20254; H05K 7/20927; H01L 23/473; F28D 1/0316;
(Continued)

(56) References Cited

U.S. PATENT DOCUMENTS 3,216,494 A * 11/1965 Goodman ............... F28F 3/046
165/166
3,612,494 A * 10/1971 Toyama ................... B01D 3/18
261/102

(Continued)

FOREIGN PATENT DOCUMENTS

DE 3134401 C1 5/1984
DE 19503766 C2 5/1996
(Continued)

OTHER PUBLICATIONS

Publication entitled "An experimental study of flow and heat transfer in sinusoidal wavy passages," by Rush, Newell and Jacobi, 1999.*

(Continued)

*Primary Examiner* — Justin Jonaitis
*Assistant Examiner* — Paul Alvare
(74) *Attorney, Agent, or Firm* — Harness, Dickey & Pierce, P.L.C.

(57) ABSTRACT

An inner fin is a wave fin having board portions extending in a pipe longitudinal direction and a top portion connecting the board portions located adjacent with each other. The wave fin has a wave-shaped cross-section perpendicularly intersecting a pipe longitudinal direction, and the board portion is bent into a waveform extending in the pipe longitudinal direction when seen from a pipe layering direction. A wave pitch WP [mm], a wave depth WD [mm], and a passage width H [mm] are set to satisfy relationships of $2.2 \leq WP/WD \leq 4.28$ and $0.5 \leq WD/H \leq 1.8$.

20 Claims, 5 Drawing Sheets

(51) Int. Cl.
*F28F 13/12* (2006.01)
*F28F 3/14* (2006.01)
*H05K 7/20* (2006.01)
*F28F 3/02* (2006.01)
*H01L 23/473* (2006.01)
*F28D 1/03* (2006.01)
*H01L 23/40* (2006.01)

(52) U.S. Cl.
CPC .......... *F28D 1/0316* (2013.01); *F28D 1/0325* (2013.01); *F28D 1/0366* (2013.01); *F28D 1/0375* (2013.01); *F28F 2215/00* (2013.01); *H01L 23/4012* (2013.01); *H01L 2924/0002* (2013.01); *H05K 7/20218* (2013.01); *H05K 7/20254* (2013.01)

(58) Field of Classification Search
CPC ...... F28D 1/0325; F28D 1/0333; F28D 1/035; F28D 1/0366; F28D 1/0375; F28F 3/025; F28F 3/06
USPC ..... 165/153, 177, 109.1, 80.4, 170; 361/699
See application file for complete search history.

(56) References Cited

U.S. PATENT DOCUMENTS

| | | | |
|---|---|---|---|
| 4,420,039 A | 12/1983 | Dubrovsky | |
| 5,078,207 A * | 1/1992 | Asano et al. | 165/153 |
| 5,454,988 A * | 10/1995 | Maeda | B01J 19/32 261/112.2 |
| 5,623,989 A | 4/1997 | Kroger | |
| 5,983,992 A * | 11/1999 | Child et al. | 165/81 |
| 6,237,679 B1 * | 5/2001 | Vestergren | F28D 9/005 165/146 |
| 6,427,764 B2 * | 8/2002 | Nash | 165/82 |
| 7,303,002 B2 * | 12/2007 | Usui et al. | 165/109.1 |
| 7,571,759 B2 * | 8/2009 | Inagaki et al. | 165/80.4 |
| 8,151,868 B2 * | 4/2012 | Inagaki | 165/80.4 |
| 2002/0007935 A1 * | 1/2002 | Marsala | 165/80.2 |
| 2005/0121173 A1 | 6/2005 | Inagaki et al. | |
| 2005/0247444 A1 * | 11/2005 | Ohata | F28D 1/0391 165/177 |
| 2006/0289152 A1 * | 12/2006 | Leuschner et al. | 165/152 |
| 2007/0056721 A1 | 3/2007 | Usui et al. | |
| 2010/0276135 A1 * | 11/2010 | Morino et al. | 165/185 |

FOREIGN PATENT DOCUMENTS

| | | |
|---|---|---|
| DE | 102006041985 A1 | 4/2007 |
| JP | 2005-191527 | 7/2005 |
| JP | 2007-175759 | 7/2007 |
| JP | 2007175759 A * | 7/2007 |
| JP | 2008-96048 | 4/2008 |
| JP | 2009-147107 | 7/2009 |
| JP | 2010-010418 | 1/2010 |
| JP | 2010010418 A * | 1/2010 |
| WO | WO-0196803 A1 | 12/2001 |

OTHER PUBLICATIONS

Translation of JP 2010010418 A entitled Translation—JP 2010010418 A.*
Office action dated Dec. 24, 2013 in corresponding Japanese Application No. 2011-095448.
JSME Data Book: "Heat Transfer 4$^{th}$ Edition", published by The Japan Society of Mechanical Engineers, Oct. 20, 1986, p. 264.

* cited by examiner

HEAT EXCHANGER HAVING A PASSAGE PIPE

CROSS REFERENCE TO RELATED APPLICATION

This application is based on Japanese Patent Application No. 2010-117715 filed on May 21, 2010 and Japanese Patent Application No. 2011-95448 filed on Apr. 21, 2011, the disclosures of which are incorporated herein by reference in their entirety.

BACKGROUND OF THE INVENTION

The present invention relates to a heat exchanger having a passage pipe through which thermal medium passes, and heat is exchanged between thermal medium and an object located outside of the passage pipe.

A conventional heat exchanger is known in which a passage pipe is arranged to sandwich a heat emitting object from both sides, and heat is emitted from the heat emitting object such as semiconductor module including a semiconductor element. In such heat exchanger, the heat emitting objects and the passage pipes are alternately layered with each other. The layered passage pipes are communicated with each other through a communication portion, and cooling medium flows each of the passage pipes.

In this kind of heat exchanger, in order to improve the heat exchanging property, a separating portion is arranged in the passage pipe so that two stairs of thermal medium passage are defined in the single passage pipe in a thickness direction. Further, an inner fin is arranged in each of the two stairs of thermal medium passage (refer to JP-A-2005-191527, for example).

By the way, in this kind of heat exchanger, because thermal medium is distributed into the passage pipes from the communication portion, a flowing speed of thermal medium in the passage pipe becomes slow. In order to improve the heat exchanging property in such low flow rate area in the passage pipe, a wave fin having a function of promoting a mixing of thermal medium in the passage pipe is used as the inner fin. A plurality of the wave fins are layered in the passage pipe in the thickness direction (refer to JP-A-2010-10418, for example).

Further, a method of promoting a turbulent flow is conventionally used so as to improve a heat transmitting ratio of the inner fin. For example, an offset fin is used as the inner fin, or a projection or slit is defined on a side face of the inner fin.

By the way, the turbulent flow promoting by the inner fin is effective in a case where a flowing speed of thermal medium in the passage pipe is fast, that is whose Reynolds number is larger than 1000 in which a flow of thermal medium is in a transient area or turbulent flow area. Further, as thermal medium flows faster, the turbulent flow is promoted so as to achieve the improvement of the property, but a flow resistance of thermal medium becomes large.

Further, in a case where the heat exchanger is used for cooling an inverter of a hybrid car, if a pump for circulating thermal medium in an inverter cooling circuit is made smaller, if a flow rate of the pump is made smaller, or if thermal medium passages are located parallel with each other, a flow rate of thermal medium passing through the passage pipe of the heat exchanger becomes small.

If the flow rate of thermal medium is small, the effect of promoting the turbulent flow cannot be obtained. Specifically, for example, when the offset fin is used as the inner fin, thermal medium flow along a wall face of the fin without colliding to the wall face, so that the expected effect of improving the property (R/ΔP) cannot be obtained.

That is, although it is known that the offset fin or pin fin is effective for promoting the turbulent flow, a property improving effect sufficiently large for canceling the increasing of the flow resistance cannot be obtained even using such fin when the flow rate of thermal medium in the passage pipe is small.

SUMMARY OF THE INVENTION

In view of the foregoing and other problems, it is an object of the present invention to secure a heat exchange amount in a heat exchanger in which thermal medium flows in a laminar flow range whose Reynolds number is 1000 or less.

In order to achieve the object, according to an example of the present invention, a heat exchanger includes a passage pipe having a thermal medium passage through which thermal medium passes, and a plurality of inner fins layered in the passage pipe. The fin divides the passage into a plurality of small passages and increases a heat transmitting area between thermal medium and the passage pipe. Thermal medium flows through the small passages in a laminar flow range with Reynolds number of 1000 or less. The inner fin has board portions extending in a longitudinal direction of the passage pipe, and a top portion which connects the board portions located adjacent with each other, so that the inner fin is a wavy fin having a wavy cross-section shape perpendicularly intersecting the longitudinal direction, and that the board portion is bent into a waveform when seen from a layering direction of the inner fins. A direction perpendicular to both of the longitudinal direction of the passage pipe and the layering direction of the inner fins is defined as a pipe width direction. The waveform of the board portion is defined to have a wave pitch WP [mm], a wave depth WD [mm] corresponding to a dimension in an amplitude direction, and a passage width H [mm] defined by a distance between the board portions located adjacent to each other in the pipe width direction, in a cross-section of the inner fin perpendicularly intersecting the layering direction and passing through a center of the small passage in the layering direction. The wave pitch WP and the wave depth WD are set to meet a relationship represented by the following Expression 1 and Expression 2

$$2.2 \leq WP/WD \leq 4.28 \qquad \text{(Expression 1)}$$

$$0.5 \leq WD/H \leq 1.8. \qquad \text{(Expression 2)}$$

Thus, the effect of promoting the mixing of thermal medium in the passage pipe can be raised by setting the wave pitch WP and the wave depth WD so as to meet the relationship represented by the Expression 1 and Expression 2, in the heat exchanger in which the flow rate of thermal medium in the passage pipe is in the low flow rate area, that is, thermal medium flows through the passage pipe in a laminar flow range with Reynolds number of 1000 or less. Accordingly, the heat exchanging amount can be secured in the heat exchanger. Further, the inner fin is secured to have easy-processing property, and a generation of clogging in the passage pipe can be restricted.

Further, in the heat exchanger, the wave pitch WP and the wave depth WD may be set to meet a relationship represented by the following Expression 3 and Expression 4

$$2.2 \leq WP/WD \leq 3 \qquad \text{(Expression 3)}$$

$$0.5 \leq WD/H \leq 1.8. \qquad \text{(Expression 4)}$$

In this case, the effect of promoting the mixing of thermal medium in the passage pipe can be raised with more reliability, so that the heat exchanging amount can be secured in the heat exchanger with more reliability.

By the way, in an area whose Reynolds number is 500-1000, a flow of thermal medium may be in a transient range depending on characteristics of thermal medium.

In contrast, in the heat exchanger, thermal medium flowing through the small passage may have Reynolds number equal to or less than 500. In this case, the flow of thermal medium flowing through the small passage can be made the laminar flow with reliability.

Further, in the heat exchanger, the passage pipe 3 may be one of a plurality of passage pipes. The passage pipes communicate with each other by a communication portion. An obstacle to exchange heat with thermal medium may be arranged outside of the passage pipes.

DETAILED DESCRIPTION OF PREFERRED EMBODIMENT

Figure 1:
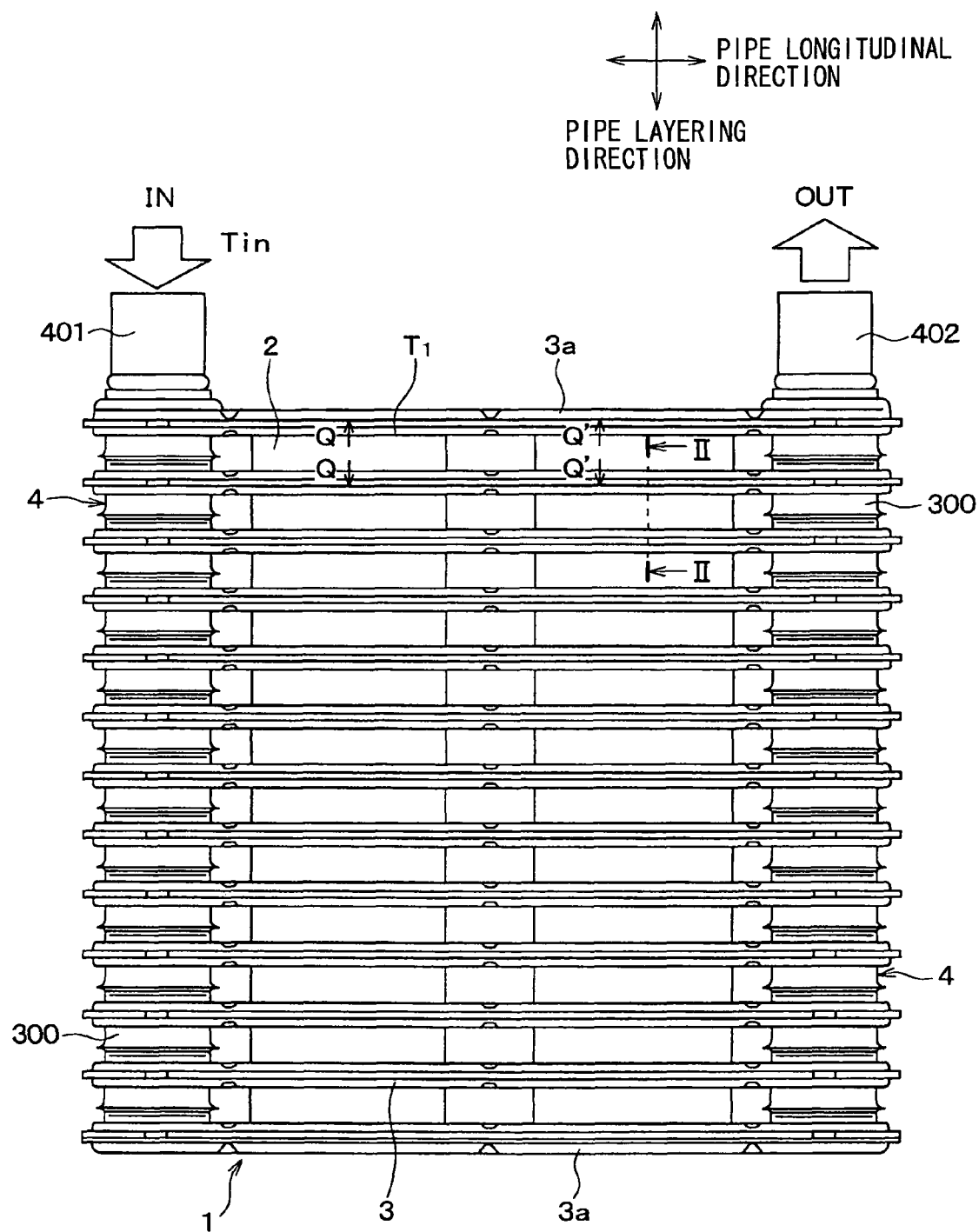
FIG. 1 is a front view illustrating a heat exchanger according to an embodiment of the present invention.

An embodiment of the present invention will be described with reference to FIGS. 1-6. FIG. 1 is a front view illustrating a heat exchanger 1 according to the embodiment.

As shown in FIG. 1, the heat exchanger 1 of the embodiment is a layered type heat exchanger, and cools plural electronic components 2 corresponding to an object with which thermal medium exchanges heat from both sides. The electronic component 2 of the embodiment has a both-sided heat-emitting structure to emit heat from the both sides.

The heat exchanger 1 has plural flat passage pipes 3 respectively having thermal medium passages 30 (see FIG. 2) through which thermal media passes, and plural communication portions 4 to make the pipes 3 to communicate with each other. The pipes 3 are layered in a manner that the electronic component 2 is interposed between the pipes 3 from both sides of the electronic component 2.

In this embodiment, a semiconductor module is used as the electronic component 2, and includes a semiconductor device such as IGBT and a diode. The semiconductor module shall be used for an inverter for a car, a motor driving inverter of an industrial instrument, an air-conditioner inverter for a building air-conditioning, etc. In addition, a power transistor, a power FET or IGBT, etc. can also be used as the electronic components 2, for example, besides the semiconductor module.

Figure 2:
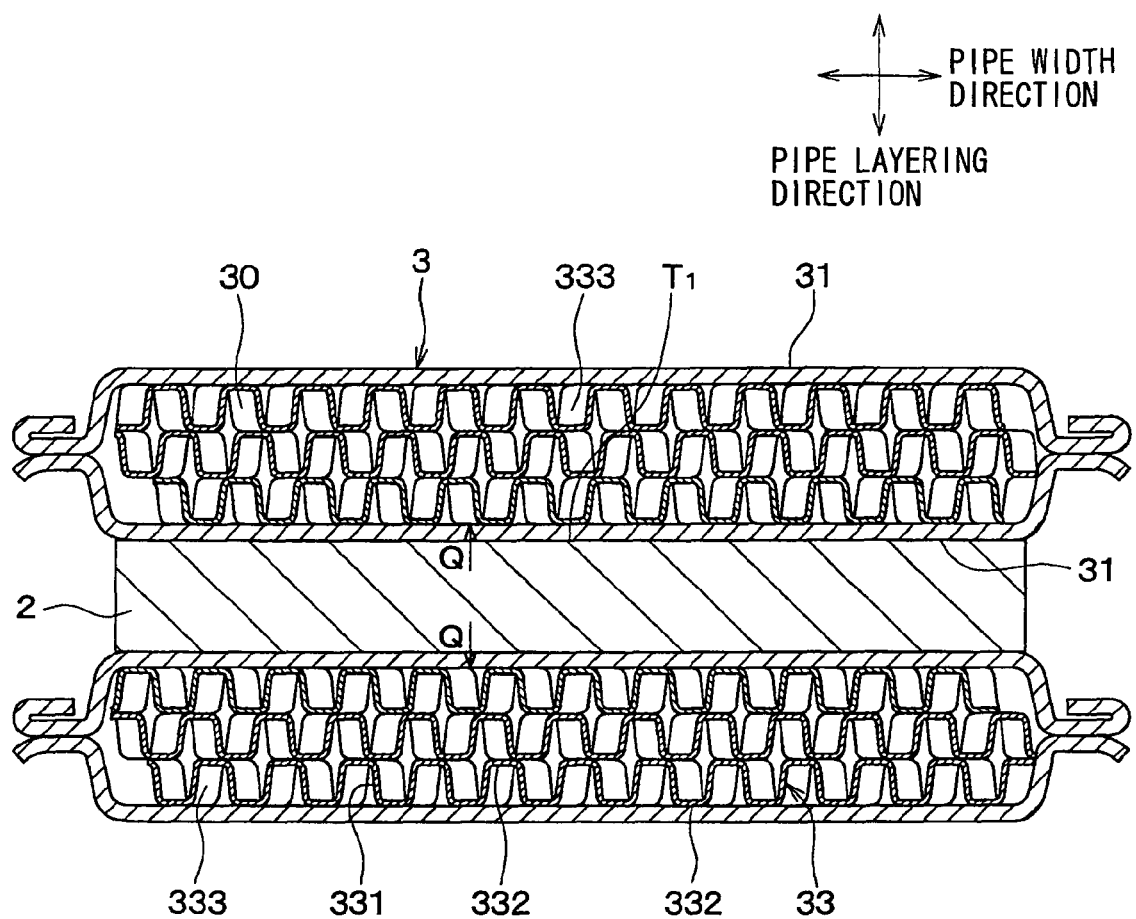
FIG. 2 is a cross-sectional view taken along line II-II of FIG. 1.

FIG. 2 is a cross-sectional view taken along line II-II of FIG. 1. As shown in FIG. 2, the passage pipe 3 of this embodiment has, what is called, drawn cup structure. That is, the passage pipe 3 is constructed to have a pair of outer shell plates 31, and the thermal medium passage 30 is defined between the pair of outer shell plates 31.

An inner fin 33 is arranged in the passage pipe 3, and divides the thermal medium passage 30 into plural small passages 333, so as to increase a heat transmitting area between thermal medium and the passage pipe 3. In this embodiment, three of the inner fins 33 are layered in a layering direction of the pipes 3 (hereinafter referred as pipe layering direction) and located between the pair of outer shell plates 31, i.e., in the thermal medium passage 30. Details of the inner fin 33 are mentioned later.

Because the three fins 33 are layered in the pipe layering direction in the thermal medium passage 30, the pipe layering direction is coincident with a layering direction of the inner fins 33.

Returning to FIG. 1, two of the electronic components 2 are arranged on each of the outer shell plates 31 of the passage pipe 3. The two electronic components 2 are located in series in a flowing direction of thermal medium.

Further, an approximately cylinder-shaped flange 300 is disposed at each end portion of the plate 31 of the pipe 3 in a pipe longitudinal direction, and protrudes outward that is toward a next-located pipe 3. The communication portion 4 is defined by brazing the flanges 300 of the pipes 3 located adjacent with each other, thereby making the pipes 3 to communicate with each other.

When the passage pipe 3 located most outside in the layering direction is defined as an outside pipe 3a, a thermal medium inlet 401 is connected to a longitudinal end portion of one of the two outside pipes 3a, and a thermal medium outlet 402 is connected to the other end portion of the one of the two outside pipes 3a. The inlet 401 introduces thermal medium into the heat exchanger 1, and thermal medium is discharged out of the heat exchanger 1 through the outlet 402. The inlet 401 and the outlet 402 are joined to the one of the two outside pipes 3a by brazing. In addition, the passage pipe 3, the communication portion 4, the thermal medium inlet 401, and the thermal medium outlet 402 of this embodiment are made of aluminum.

Thermal medium introduced through the inlet 401 flows into each passage pipe 3 through the communication portion 4. Then, thermal medium flows through each thermal medium passage 30 from one end to the other end in the longitudinal direction. Then, thermal medium flows through the communication portion 4 and is discharged from the outlet 402. Thus, while thermal medium flows through the thermal medium passage 30, heat exchange is performed between the electronic components 2 and thermal medium, thereby cooling the electronic components 2.

In the heat exchanger 1 of this embodiment, thermal medium passes through the small passages 333 in a laminar-flow range whose Reynolds number is 1000 or less. In the embodiment, water containing ethylene glycol base anti-freezing solution is used as thermal medium.

By the way, a flow of thermal medium may be a transient-flow in an area whose Reynolds number is 500-1000, depending on characteristics of thermal medium. For this reason, it is desirable that thermal medium flowing through the small passages 333 has Reynolds number equal to or less than 500. Thus, the flow of thermal medium flowing through the small passages 333 can be certainly made into the laminar-flow.

Figure 3A:
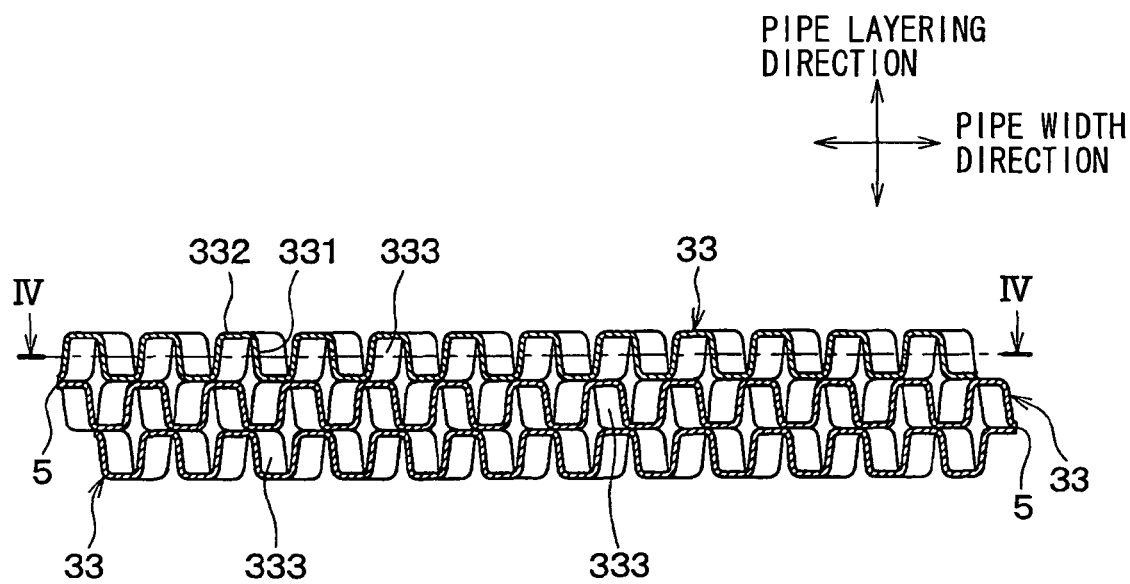
FIG. 3A is a cross-sectional view perpendicularly intersecting a pipe longitudinal direction illustrating a cross-sectional shape of an inner fin.
Figure 3B:
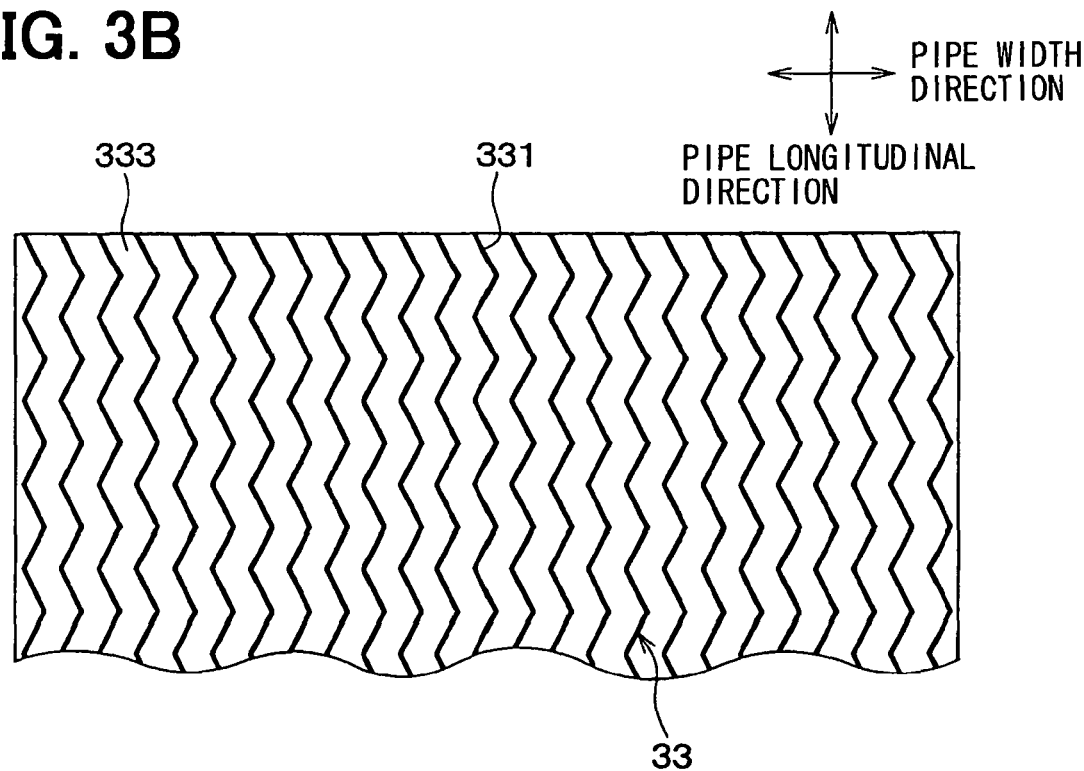
FIG. 3B is a plan view illustrating the inner fin seen from a pipe layering direction.

FIG. 3A and FIG. 3B illustrate the inner fin 33 of the heat exchanger 1 according to the embodiment. FIG. 3A is a cross-sectional view illustrating a cross-sectional shape perpendicularly intersecting the longitudinal direction of the pipe 3 (hereinafter referred as pipe longitudinal direction). FIG. 3B is a plan view seen from the pipe layering direction.

As shown in FIG. 3A and FIG. 3B, a wave fin is used as the inner fin 33, and three of the fins 33 are layered in the single pipe 3. Specifically, the inner fin 33 has board portions 331 and top portions 332. The board portion 331 extends in the pipe longitudinal direction and defines the small passages 333. The top portion 332 connects the board portions 331 located adjacent with each other. The cross-section shape of the inner fin 33 perpendicularly intersecting the pipe longitudinal direction is formed into a trapezoid wave shape. The board portion 331 is bent into triangle waveform continued in the pipe longitudinal direction, when seen from the pipe layering direction.

Figure 4:
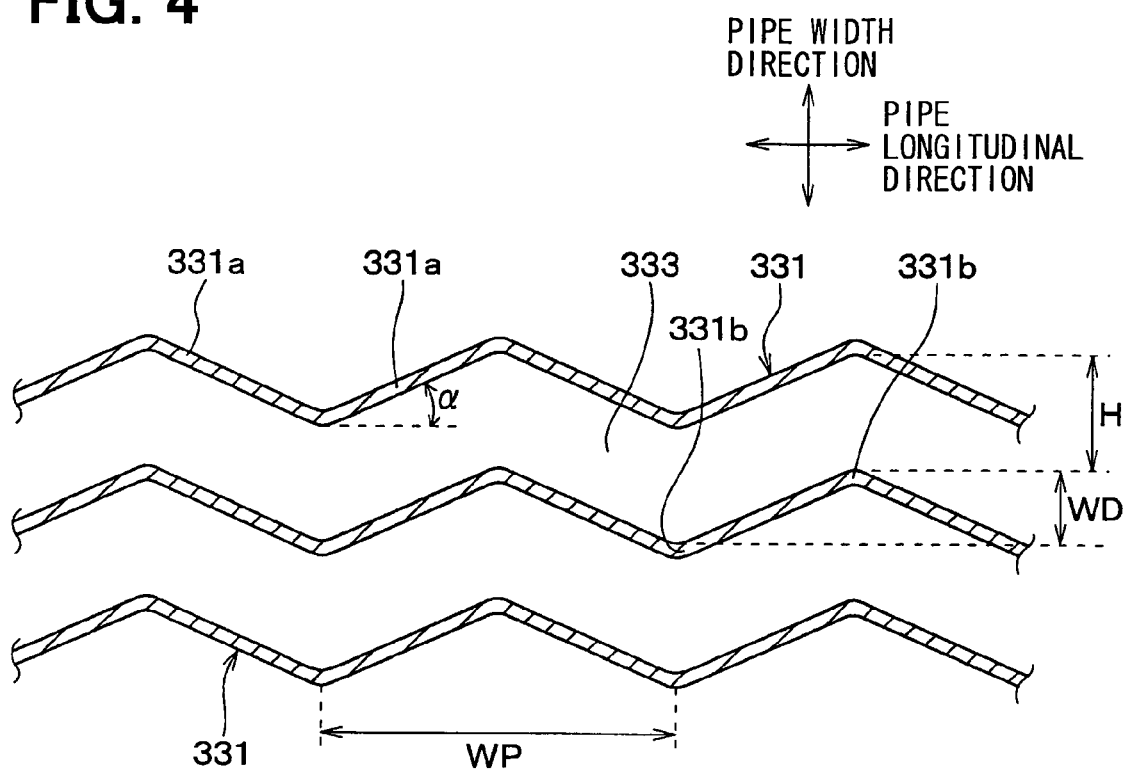
FIG. 4 is a cross-sectional view taken along line IV-IV of FIG. 3A.

FIG. 4 is a IV-IV sectional view of FIG. 3A, that is, a cross-sectional view of the inner fin 33 which perpendicularly intersects the pipe layering direction. Further, FIG. 4 is a cross-sectional view which passes through a central part of the small passage 33 in the pipe layering direction. Here, a direction perpendicular to both of the pipe longitudinal direction and the pipe layering direction is defined as a pipe width direction.

Further, in the cross-sectional view of the inner fin 33 perpendicularly intersecting the pipe layering direction and passing through the central part of the small passage 33 in the pipe layering direction (hereinafter referred as center cross-section), a bending angle of the triangle waveform of the board portion 331 is defined as a wave angle $\alpha[°]$. That is, in the center cross-section, the wave angle $\alpha$ is an angle defined by linear parts 331a of the single board portion 331 located adjacent with each other in the pipe longitudinal direction.

Moreover, in the center cross-section, a dimension of the triangle waveform of the board portion 331 in an amplitude direction is defined as a wave depth WD [mm]. That is, in the center cross-section, the wave depth WD is a distance defined between top parts 331b of the single board portion 331 located adjacent with each other in the pipe width direction.

Moreover, in the center cross-section, a pitch of the waveform of the board portion 331 is defined as a wave pitch WP [mm]. Furthermore, in the center cross-section, a distance between the board portions 331 located adjacent with each other in the pipe width direction is defined as a passage width H [mm].

By the way, like this embodiment, in the layering type heat exchanger 1 which cools the electronic component 2 using thermal medium, as a distance from the electronic component 2 becomes large, a temperature of thermal medium in the pipe 3 becomes low, so that heat exchanging efficiency of the inner fin 33 is lowered. Here, although a heat exchanging property of the heat exchanger 1 is proportional to a heat transmitting area, if the heat exchanging efficiency is lowered, an effect of improving the property will not be acquired even when the heat transmitting area is increased by the inner fin 33.

In contrast, the property can be raised by promoting a turbulent flow if a flow rate of heat-exchange medium is large. However, in a low flow rate range whose Reynolds number is 1000 or less, thermal medium passes by without colliding to an obstacle (the board portion 331 of the inner fin 33), so that a predetermined heat exchanging property cannot be obtained.

In order to solve this problem, it is effective to compulsorily move thermal medium in the pipe 3. Experiments and examinations performed by the inventor of the present invention make it clear that it is optimal to use a wave fin as the inner fin 33, in the low flow rate range.

However, there is dramatically little literature referring to optimal specifications of the wave fin. Moreover, because the wave fin is originally used as means for promoting turbulent flow, research has been made about the optimal specifications in a transient flow area to a turbulent-flow area whose Reynolds number is 1500 or more (refer to JSME Data Book: Heat Transfer (4th edition of revision) (The Japan Society of Mechanical Engineers)). However, optimal specifications in the low flow rate range (Re≤1000) are not referred in it.

Figure 5:
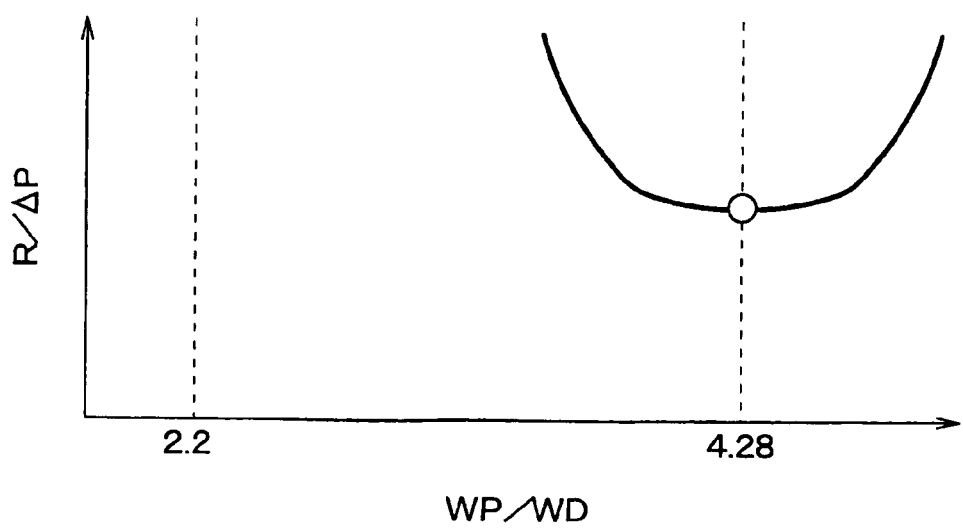
FIG. 5 is an explanatory view illustrating a heat exchanging property of a wave fin in a case of Re≥1500.

FIG. 5 is an explanatory view illustrating the heat exchanging property of the wave fin in a case of Re≥1500. A lateral axis of FIG. 5 represents WP/WD, and a vertical axis of FIG. 5 represents R(thermal resistance)/ΔP(pressure loss in the passage pipe 3). The heat exchanging property is raised, as the R/ΔP is made smaller.

Here, a temperature of thermal medium which flows into the pipe 3 is defined as $T_{in}[°C.]$. A temperature of a surface of the electronic component 2, that is contacting an outer surface of the pipe 3 is defined as $T_1[°C.]$. A heat emitting amount of the electronic component 2 is set as Q[W]. At this time, the following Expression F1 represents the thermal resistance R[°C./W].

$$R=(T_1-T_{in})/Q \qquad (F1)$$

As shown in FIG. 5, in the case of Re≥1500, the R/ΔP has a certain local minimum, due to flow exfoliation generated by the wave fin and increase in the flow resistance of thermal medium. That is, as the WP/WD is made smaller, the flow resistance of thermal medium becomes smaller, but the effect of improving the heat exchanging property by the wave fin becomes low. In contrast, as the WP/WD is made larger, the effect of improving the heat exchanging property by the wave fin becomes high, but the flow resistance of thermal medium becomes larger. According to the above-mentioned JSME Data Book: Heat Transfer, the local minimum (optimal condition) is obtained when the WD/H is 0.25 and when the WP/WD is 4.28.

In contrast, according to the embodiment, when thermal medium flowing in the passage pipe 3 is in the low flow rate range (Re≤1000), a variation of the pressure loss (ΔP) in the passage pipe 3 is reduced because thermal medium flows along a wall face of the board portion 331. Moreover, as a frequency of moving thermal medium in the passage pipe 3 is made higher, the mixing of thermal medium is promoted, so that a temperature difference of thermal medium in the passage pipe 3 becomes small.

Therefore, in the low flow rate range, in order to increase the frequency of mixing thermal medium, it is desirable to make the wave pitch WP as small as possible. For this reason, the wave pitch WP is set as not less than 2.2 mm in consideration of processing limit in the actual condition.

By the way, movement of thermal medium in the passage pipe 3 becomes intense, as the wave depth WD of the inner fin 33 is increased with respect to the passage width H. That is, the effect of promoting the mixing becomes high. Therefore, it is desirable to make the wave depth WD as large as possible with respect to the passage width H. However, in a case where the wave pitch WP is made close to the minimum value (2.2 mm) which mentioned above, if the wave depth WD is made larger than 1.8 times of the passage width H, there is a possibility that a metal plate to be processed into the wavy shape may be torn at the time of producing the wave. For this reason, it is necessary to set the wave depth WD as 1.8 or less times of the passage width H.

Moreover, it is necessary to set the passage width H as 0.9 mm or more in consideration of clogging property. Therefore, in order to reconcile the effect of promoting the mixing and the clog-proof property, it is desirable to set the wave depth WD as 1 mm.

Then, there is a relationship of WP/WD≈2.2 when the wave pitch WP is 2.2 mm and when the wave depth WD is 1 mm. Therefore, in this embodiment, the WP/WD is set equal to or more than 2.2.

In contrast, if the wave pitch WP exceeds 4 mm, when the wave depth WD is set as 0.9 mm, the wave bent angle α will be about 20° at the maximum. In this case, the effect of promoting the mixing in the low flow rate range is remarkably lowered. Here, when the wave pitch WP is set as 4 mm and when the wave depth WD is set as 0.9 mm-1 mm, there is a relationship of WP/WD=4-4.4. For this reason, in this embodiment, the WP/WD is set equal to or less than 4.28 that is the value disclosed by the above-mentioned JSME Data Book: Heat Transfer.

Figure 6:
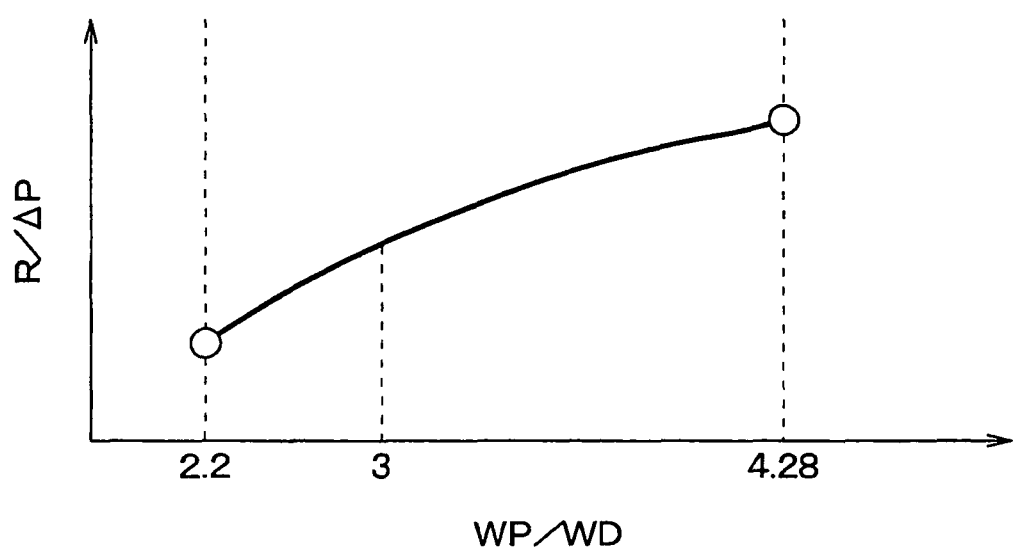
FIG. 6. is an explanatory view illustrating a heat exchanging property of a wave fin in a case of Re≤500.

FIG. 6 is an explanatory view illustrating the heat exchanging property of the wave fin in a case of Re≤500. A lateral axis of FIG. 6 shows WP/WD, and a vertical axis of FIG. 6 shows R/ΔP.

As shown in FIG. 6, the wave pitch WP and the wave depth WD are set so as to meet a relationship represented by the following Expression 1.

$$2.2 \leq WP/WD \leq 4.28 \quad \text{(Expression 1)}$$

According to experiments performed by the inventor of the present invention, when the WP/WD is 3 or less, the effect of promoting the mixing becomes especially high. Therefore, it may be desirable to set the WP/WD in a range equal to or larger than 2.4 and equal to or smaller than 3.

By the way, as mentioned above, the effect of promoting the mixing thermal medium in the passage pipe 3 becomes high, as the wave depth WD of the inner fin 33 is increased, so that it is desirable to make the wave depth WD as large as possible. For this reason, in the embodiment, the wave depth WD is set equal to or more than ½ of the passage width. However, in a case where the wave pitch WP is made close to the minimum value (2.2 mm) which mentioned above, if the wave depth WD is made larger than 1.8 times of the passage width H, there is a possibility that the metal plate may be torn at the processing time. Therefore, in the embodiment, the wave depth WD is set as 1.8 or less times of the passage width H.

That is, the wave depth WD is set to meet a relationship represented by the following Expression 2.

$$0.5 \leq WD/H \leq 1.8 \quad \text{(Expression 2)}$$

In a conventional heat exchanger using a straight fin or an offset fin as an inner fin, the heat exchanging property of the inner fin is aimed to be improved by the effect of promoting the turbulent flow.

In contrast, according to the embodiment, the heat transmitting area between thermal medium and the inner fin 33 is aimed to be increased by using the wave fin as the inner fin 33.

Further, in the embodiment, the inner fin (wave fin) 33 is arranged in the laminar-flow area in which thermal medium flows slowly. Furthermore, the wave pitch WD and the wave depth WD are defined to have the relationship shown in the Expression 1 and the Expression 2. Thus, the mixing of thermal medium in the passage pipe 3 is promoted, and thermal medium having low temperature can be easily supplied to a part corresponding to the electronic component 2 in the passage pipe 3.

That is, in this embodiment, a heat exchanging amount of the heat exchanger 1 is secured not by the effect of promoting the turbulent flow using the inner fin 33 but by the effect of promoting the mixing of thermal medium.

Therefore, the wave pitch WP and the wave depth WD are set to have the relationship shown in the Expression 1 and the Expression 2, in the heat exchanger in which the flow rate of thermal medium in the pipe 3 is in the low flow rate area, that is, thermal medium passes through the small passages 333 of the pipe 3 in the laminar-flow area whose Reynolds number is 1000 or less. Thus, the workability of the inner fin 33 (wave fin) is secured, and the clogging of the passage pipe 3 is restricted. Further, it becomes possible to secure the heat exchanging amount by increasing the effect of promoting the mixing of thermal medium in the passage pipe 3.

The present invention is not limited to the above embodiment, and may be variously modified within the scope of the present invention.

The three fins 33 are layered in the single pipe 3 in the above embodiment. Alternatively, two of the fins 33 may be layered in the single pipe 3.

The electronic component 2 is not limited to have the both-sided heat emitting structure. Alternatively, the electronic component 2 may have single-sided heat emitting structure.

Sign Q' described in FIG. 1 means a heat amount [W] emitted from the electronic component 2. The sign Q' may be the same as Q [W], and may differ from.

What is claimed is:
1. A heat exchanger comprising:
a passage pipe having a thermal medium passage through which thermal medium passes; and
a plurality of inner fins layered in the passage pipe, the plurality of fins dividing the passage into a plurality of small passages and increasing a heat transmitting area between the thermal medium and the passage pipe, wherein
the thermal medium flows through the small passages in a laminar flow range with Reynolds number of 1000 or less,
each of the plurality of inner fins has board portions extending in a longitudinal direction of the passage pipe, and a top portion which connects the board portions located adjacent with each other, the inner fin being a wave fin having a wave-shaped cross-section perpendicularly intersecting the longitudinal direction, the board portion having a waveform extending in the longitudinal direction when seen from a layering direction of the plurality of inner fins,
a direction perpendicular to both of the longitudinal direction of the passage pipe and the layering direction of the inner fins is defined as a pipe width direction,
the inner fin has a wave pitch WP defined by a pitch of the waveform of the board portion, a wave depth WD defined by a dimension of the waveform of the board portion in an amplitude direction, and a passage width H defined by a distance between the board portions located adjacent to each other in the pipe width direction, in a cross-section perpendicularly intersecting the layering direction in the longitudinal direction and passing a center part of the small passage in the layering direction, and
the wave pitch WP and the wave depth WD are set to meet a relationship represented by the following Expression 1 and Expression 2 wherein Expression 1 is $2.2 \leq WP/WD \leq 3$ wherein Expression 2 is $0.5 \leq WD/H \leq 1.8$;

wherein a cross-sectional shape of the inner fin perpendicularly intersecting the longitudinal direction has a trapezoid wave shape;

wherein the wave pitch WP and the wave depth WD are set to meet the relationship represented by Expression 1 and Expression 2 in the cross-section perpendicularly intersecting the layering direction and passing the center part of the small passage in the layering direction in a state where the cross-sectional shape of the inner fin perpendicularly intersecting the longitudinal direction has the trapezoid wave shape;

wherein the inner fin has a triangle wave shape extending in the longitudinal direction and has the trapezoid wave shape extending in the pipe width direction; and wherein each of the inner fins stacked in the layering direction is offset and staggered in a direction perpendicular to the layering direction.

2. The heat exchanger according to claim 1, wherein the thermal medium passing through the small passage has Reynolds number equal to or less than 500.

3. The heat exchanger according to claim 1, further comprising:
a communication portion; and an object to exchange heat with thermal medium, wherein
the passage pipe is one of a plurality of passage pipes,
the plurality of passage pipes communicate with each other by the communication portion, and
the object is arranged outside of the plurality of passage pipes.

4. The heat exchanger according to claim 1, wherein the plurality of layered fins are disposed in a single thermal medium passage.

5. The heat exchanger according to claim 1, wherein mixing of the thermal medium is promoted by the inner fin.

6. The heat exchanger according to claim 1, wherein each of the plurality of fins is in direct contact with an adjacent fin.

7. The heat exchanger according to claim 1, wherein the plurality of fins include three fins stacked in the layering direction.

8. The heat exchanger according to claim 7, wherein each of the plurality of fins is in direct contact with an adjacent fin.

9. The heat exchanger according to claim 7, wherein a first fin of the three fins is in direct contact with the passage pipe, a second fin of the three fins is in direct contact with the passage pipe and a third fin of the three fins is disposed between the first and second fins.

10. The heat exchanger according to claim 9, wherein each of the small passages defined by the third fin being in direct fluid communication with an adjacent small passage defined by one of the first and second fins.

11. The heat exchanger according to claim 9, wherein a first top portion of the third fin is in direct contact with a top portion of the first fin and a second top portion of the third fin is in direct contact with a top section of the second fin.

12. The heat exchanger according to claim 9, wherein each of the three fins defines a triangular waveform extending in the longitudinal direction, the triangular waveform of the third fin being opposite to the triangular waveform of the first and second fin.

13. The heat exchanger according to claim 12, wherein each of the small passages defined by the third fin being in direct fluid communication with an adjacent small passage defined by one of the first and second fins.

14. The heat exchanger according to claim 1, wherein each of the small passages defined by one of the plurality of fins stacked in the layering direction is asymmetrical to each of the small passages defined by an adjacent fin.

15. The heat exchanger according to claim 1, wherein each of the small passages defined by one of the plurality of fins stacked in the layering direction is offset and staggered from each of the small passages defined by an immediately adjacent fin.

16. The heat exchanger according to claim 1, wherein a center point of each top portion defined by one of the plurality of fins stacked in the layering direction is not aligned with a center point of each top portion defined by an adjacent fin.

17. The heat exchanger according to claim 1, wherein adjacent top portions defined by each of the plurality of fins include alternating adjacent top portions in the longitudinal direction when seen from the layering direction.

18. The heat exchanger according to claim 1, wherein adjacent top portions defined by each of the plurality of fins share board portions.

19. The heat exchanger according to claim 1, wherein a first fin of the plurality of inner fins opposes to a first object to exchange heat with thermal medium outside of the passage pipe, and a second fin of the plurality of inner fins opposes to a second object to exchange heat with thermal medium outside of the passage pipe.

20. The heat exchanger according to claim 1, wherein the plurality of fins include three fins stacked in the layering direction, the second fin of the three fins Is disposed between the first fin of the three fins and the third fin of the three fins, and wherein a center point of each top portion defined by the first fin is aligned with a center point of each top portion defined by the third fin.

* * * * *